United States Patent [19]

Rosenthal

[11] Patent Number: 4,777,442

[45] Date of Patent: Oct. 11, 1988

[54] NMR QUALITY ASSURANCE PHANTOM

[75] Inventor: Marc S. Rosenthal, Pittsburgh, Pa.

[73] Assignee: University of Pittsburgh, Pittsburgh, Pa.

[21] Appl. No.: 85,020

[22] Filed: Aug. 12, 1987

[51] Int. Cl.$^4$ .............................................. G01R 33/20
[52] U.S. Cl. .................................... 324/318; 324/309
[58] Field of Search ............... 324/300, 307, 309, 318, 324/321

[56] References Cited

U.S. PATENT DOCUMENTS

| | | | |
|---|---|---|---|
| 4,551,678 | 11/1985 | Morgan | 324/321 |
| 4,613,819 | 9/1986 | Chui | 324/318 |
| 4,618,826 | 10/1986 | Smith | 324/318 |
| 4,625,168 | 11/1986 | Meyer | 324/318 |
| 4,644,276 | 2/1987 | Sierocuk | 324/307 |
| 4,692,704 | 9/1987 | Gray | 324/318 |
| 4,701,709 | 10/1987 | Yamamoto | 324/309 |

*Primary Examiner*—Michael J. Tokar
*Attorney, Agent, or Firm*—Reed Smith Shaw & McClay

[57] ABSTRACT

A phantom for quality assurance and control of an NMR scanner. The phantom is comprised of a first structure that sealingly encloses a holder and a second structure with a rod set at an acute angle from a longitudinal axis of the first structure. The first and second structures, the rod and the holder are made of acrylic. The holder has a plurality of tubes which hold varying concentrations of dueterium oxide. A loading solution of copper fills the remaining space within the first stucture.

20 Claims, 6 Drawing Sheets

NMR QUALITY ASSURANCE PHANTOM

FIELD OF THE INVENTION

The present invention relates to phantoms for quality assurance of NMR scanners. more specifically, the present invention relates to a phantom having varying concentrations of deuterium oxide in water.

BACKGROUND OF THE INVENTION

With the increasing use of nuclear magnetic resonance (NMR) imaging systems, the ability to quantitate the systems' performance on a daily or regular basis becomes important in order to maintain diagnostic accuracy. While a variety of phantoms following the design of computerized tomography (CT) phantoms have been developed for NMR imagers, they all perform only a few tasks.

In U.S. Pat. No. 4,551,678 to Morgan, et al. there is disclosed a phantom that has the ability to measure spin density using solutions with varying spin densities relative to distilled water, such as 100%, 90% and 80%. It is further taught that by changing the spin density there will be a change in the T1 and T2, the spin-lattice and spin-spin decay constants, respectively, characteristic of the solutions. There is also taught to use a multiplicity of tubes to measure slice thickness, slice offset, low and high contract sensitivity, resolution, and possibly linearity. The phantom taught in Morgan, et al. is not designed to look for artifacts in the image such as quadrature error, ghosting, etc.

In U.S. Pat. No. 4,618,826 to Smith, et al. there is disclosed a phantom primarily designed for measurement of slice angle and image slice offset. This phantom is designed to measure image slice offset and slice thickness.

In U.S. Pat. No. 4,613,819 to Chui there is disclosed a phantom that will measure resolution, slice thickness and offset, contrast, and T1 and T2.

In U.S. Pat. No. 4,625,168 to Meyer, et al. there is disclosed a phantom that measures resolution, linearity of the image, and sensitivity. In Meyer, et al., the sensitivity being measured is the measurement of linearity using a pie shaped object with varying thickness. Meyer, et al. does not measure intrinsic sensitivity of an NMR system. In addition, Meyer, et al.'s technique for the measurement of linearity requires that a thick slice be used; that the slice center is perfectly aligned; and it is assumed that a change in signal is only due to the number of protons within the slice, with no effect (e.g., partial volume effect), because the thinner areas are close to the slice edge.

The intrinsic sensitivity of an imager is dependent on the type of RF coils, the impedance matching of the coils, the system resolution, the pulse sequence, and the loading of the RF coils by the patient or sample. Several of these factors are easily controlled; some are not. Given a fixed, stable phantom, any changes occurring with time of the signal from the phantom for a given pulse sequence will generally indicate changes in machine function, i.e., changes in the linearity of the gradients, RF pulses, field homogeneity, coil loading, coil impedance, A/D problems, or amplifier/receiver problems for the RF.

If any of the above changes occur, one would expect changes in the machine sensitivity. With most phantoms currenty used for the signal to noise ratio measurement, the ratio is betweena strong signal and background, see, Brateman, L., Jennings, L. W., Nunnally, R. L., et al., *Med. Phys.*, 13(4):441–448 (1986); Price, R. R., Patton, J. A., Erickson, J. J., et al., *NMR In Medicine: The Instrumentation and Clinical Applications*, Eds. S .R. Thomas and R. L. Dixon, 1986, page 414. (The latter reference discusses the use of deuterium oxide and water mixtures, $D_2O/H_2O$, for measuring signal linearity and also provides a more complete discussion of NMR image parameters and their calculations).

One parameter that will indicate whether or not an NMR imaging system is operating within some of its specifications is the intrinsic sensitivity of the system for a particular solution or sample. This is one among the many parameters which caracterize an NMR system. In order to measure intrinsic sensitivity, the requirement of varying the tracer (or proton) concentration which provides the signal requires that the decay constants T1 and T2, must remain relatively constant. By using sensitivity as a measure, a difference of only a few percent will be visually noticeable.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

SUMMARY OF THE INVENTION

Accordingly, one object of the present invention is to provide a phantom that has a loading factor which is similar to the human head or body.

Another object of the present invention is to provide a phantom that utilizes varying concentrations of deuterium oxide and water to determine the intrinsic sensitivity and the linearity of an NMR scanner.

Another object of the present invention is to provide a phantom that allows measurement of intrinsic sensitivity, linearity as a function of proton concentration, slice thickness, slice spacing, slice continuity, signal to noise ratio, contrast to noise ratio, phase error detection (partial, in the quadrature detection of the received signal) and uniformity within a slice in the transverse, sagittal and coronal views of an NMR scanner.

These and other objects of the present invention are achieved with a phantom for quality assurance of an NMR scanner which is a preferrd embodiment comprises a first sealed support structure made of a material having a very short T1 and T2 so a signal is not produced by the first structure from the NMR scanner, said first structure being hollow and having a longitudinal axis; a holder having a plurality of tubes, said holder positioned in the hollow of the first structure, said holder made of a material having very short T1 and T2 decay constants so a signal is not produced by the holder, said tubes being sealed and having varying concentrations of a material whose T1 and T2 do not change as a function of concentration, each of said tubes being surrounded by enough holder material so a distinct image from each tube is produced from the NMR scanner and any artifacts around each tube from the NMR scanner are apparent, said tubes allowing for the calculation of the intrinsic sensitivity and linearity of the NMR scanner; and a paramagnetic material filling the hollow of the first structure and surrounding the holder and second structure with the rod.

In a more preferred embodiment, a second support structure is positioned inside the first support structure and adjacent the holder. The second structure supports a rod that is fixed at an acute angle with respect to the longitudinal axis. The rod and second structure is made of a material having very short T1 and T2 signal decay constants so a signal is not produced. The rod allows for the calculation of the slice thickness and slice spacing of the NMR scanner.

DESCRIPTION OF THE PREFERRED EMBODIMENTS

Figure 1:
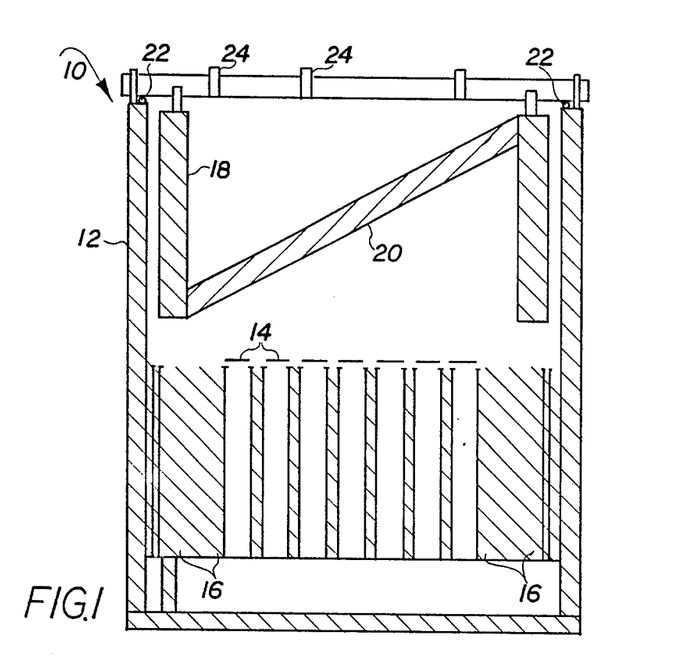
FIG. 1 is a cross-sectional view of the phantom.

Referring now to the drawings, wherein like reference numerals designate identical or corresponding parts throughout the several views, and more particularly to FIG. 1 thereof, there is shown a phantom 10 for quality assurance and quality control of an NMR scanner (not shown). The phantom 10 is comprised of a sealed first support structure 12 that encases tubes 14 containing varying concentrations of deuterium oxide. The tubes 14 are located in a holder 16 that is positioned at the bottom of the first support structure 12. A second support structure 18 is positioned atop the holder 16 and inside the first structure 12. The second structure 18 has a rod 20 placed diagonally across the second structure 18. Surrounding all the components and filling the remaining area inside the first structure 12 is a solution containing a paramagnetic material.

More specifically, the phantom 10 allows the measurement of a variety of system parameters. With the phantom 10 the intrinsic sensitivity, slice thickness, slice spacing, relative signal to noise, relative contrast to noise, uniformity, linearity, and quadrature error can be evaluated.

The first support structure 10 that defines the outer shell of the phantom is made of a transparent plastic polymer. What is most important with the structure 10 is that it essentially does not provide any signal. In other words, the material must have a T1 and T2 decay constant which is so short that no signal is produced. Short T1 and T2 decay constants are T1 and T2 decay constants preferably less than 200 microseconds. Preferably, the first structure 12 is made of acrylic and is a cylindrical tank 12 which is permanently sealed at one end and sealed at the other end with an O-ring 22 and nylon or Teflon (non-metallic screws) screws 24.

Figure 2:
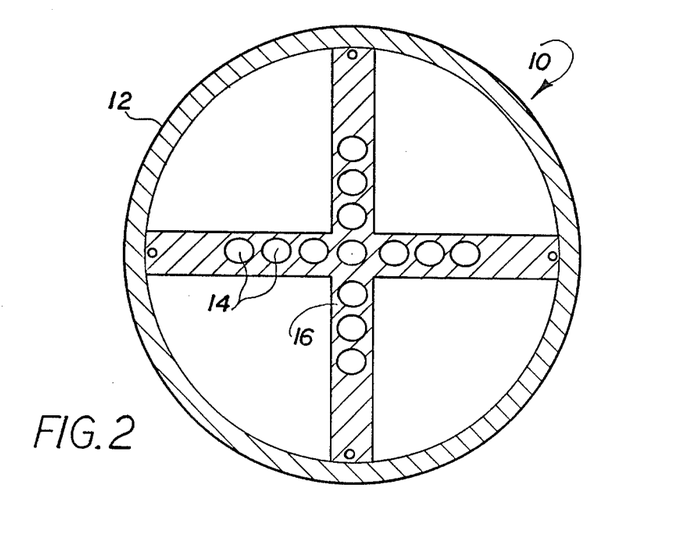
FIG. 2 is an overhead view of the phantom.
Figure 5:
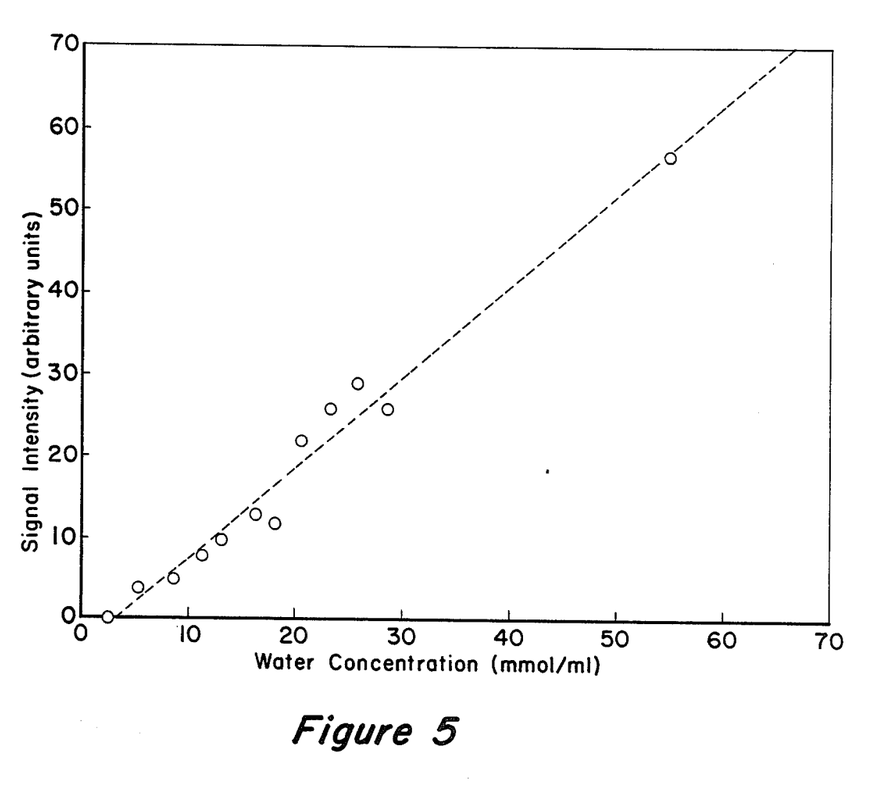
FIG. 5 is a plot of signal intensity versus concentration of deuterium oxide.

The holder 16 which fits into the tank 12 must also essentially not produce a signal. The holder 16 has the tubes 14 drilled into it. These tubes 14 hold varying concentrations of deuterium oxide and water that allows for the measurement of the linearity and the intrinsic sensitivity of the NMR system. This is accomplished because the decay constants T1 and T2 for the deuterium oxide and water mixtures do not change significantly as a function of concentration. For instance, a plot, as shown in FIG. 5, of signal intensity versus concentration yields the linearity and minimum sensitivity of the scanner. The tubes 14 should have a depth at least as thick as the thickest slice from the scanner and preferably a depth twice as thick as the thickest slice. Such a thickness eliminates any partial volume effect. The internal diameter of each tube 14 should be wide enough to provide a large enough number of pixels to afford using visual interpretation of the signal produced therefrom and good statistics for quantitative evaluation. What is important with regard to the tube size is that it produce an average value corresponding to the deuterium oxide and water concentrations therein with little error. The distance between the tubes should be enough to allow a clear visual reading of each tube. Preferably, there are two rows of seven tubes orthogonal to each other with a common center tube, forming a "plus sign" as shown in FIG. 2. This design is chosen to allow enough acrylic around each tube to provide good contrast for the image of the tube and to allow enough paramagnetic material to be interdispersed throughout the phantom so the system is loaded properly, as is discussed below. Other structures, such as a concentric ring structure, could be used, but are more difficult to manufacture. With one exception, each tube 14 is sealed to prevent contamination of the solution. Table 1 shows a current scheme of preferred concentrations of protons in deuterium for the tubes 14.

TABLE 1

| Tube | Concentration of Protons |
|---|---|
| 1 | 5.2 ± .5 mmol/ml |
| 2 | 11.0 ± 1 mmol/ml |
| 3 | 17.6 ± 2 mmol/ml |
| 4 | 22.8 ± 2 mmol/ml |
| 5 | 26.6 ± 3 mmol/ml |
| 6 | 32.8 ± 3 mmol/ml |
| 7 | 36.4 ± 4 mmol/ml |
| 8 | 41.4 ± 4 mmol/ml |
| 9 | 46.8 ± 4 mmol/ml |
| 10 | 51.5 ± 5 mmol/ml |
| 11 | 57.3 ± 6 mmol/ml |
| 12 | 110 mmol/ml |

One tube 14 preferably is not sealed, but left open and filled with the paramagnetic material that fills the tank 12. The paramagentic material provides a very strong signal from exposure to the magnetic field of the NMR scanner and allows a viewer to determine at a visual first analysis the integrity of the subject NMR scanner. This is simply done by comparing the image from the acrylic around the tube containing the paramagnetic material and to the strong bright-image from that tube specifically looking for any artifacts in the image from the acrylic. The contrast from the tube of copper sulfate solution makes it easier to visually see any artifacts. Their existence usually indicates the images from the NMR scanner are inaccurate or there exist problems.

Figure 3:
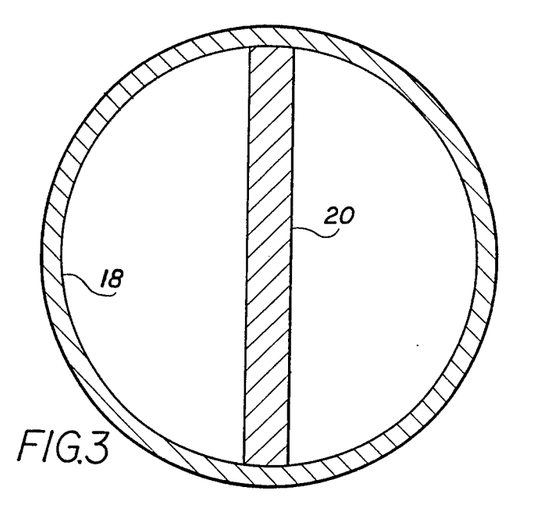
FIG. 3 is a top view of the cylinder with the rod.
Figure 4:
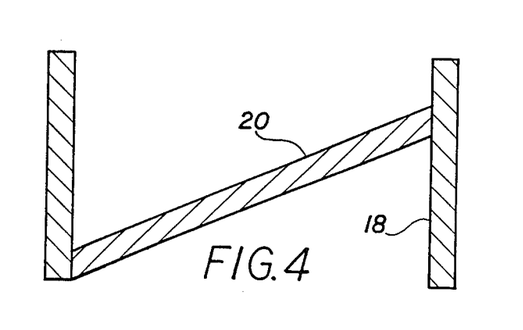
FIG. 4 is a cross-sectional view of the cylinder with the rod.

The second support structure 18's material requirements are the same as the first support structure 12's material requirements. The material must have a short enough T1 and T2 decay constants that it essentially does not produce a signal. The second support structure 18 can preferably also consist of a cylinder 18 that is placed within the tank 12 and above the tubes 14. The cylinder 18 preferably has at its top feet 24 that are received by the top of the tank 12 so the cylinder 18 does not move. A thick rod 26 is set at an acute angle with respect to the tank's longitudinal or Z axis, as shown in FIG. 3. The cylinder 18's purpose is to hold the rod 26 in place. The rod allows the measurement of slice thickness and spacing. The rod 26, also made of acrylic, is preferably angled such that for a 1 cm slice thickness, the width of a displayed image corresponding to the rod 26 is 1 cm for a calibrated system within its statistical uncertainty.

The remaining space within the phantom 10 is filled with the loading solution of the paramagnetic material. A paramagnetic material is chosen because it provides a strong response from the NMR scanner and this is important for the reasons discussed above. The paramagnetic material can be, for instance, barium sulfate, or preferably copper sulfate. In a preferred embodiment, 3 g of copper sulfate are added to 7100 ml doubly distilled deionized water to form a concentration of 0.004 mmol/ml. The total volume of the phantom (with inserts) is 7200 ml. In addition to this mixture, 100 ml of propanol is added as a preservative in which case 100 ml less of the deionized water is used. The total amount of solution put into the phantom is 7100 ml. The solution filling the phantom 10 provides a loading factor close to the human head or body. The overall size of the phantom 10 also is similar in size to the human head.

Preferably, all walls of the phantom are $\frac{1}{4}$ inch thick acrylic and all hardware is either nylon or teflon screws at 10/32 inches. The internal diameter of each tube 14 is about 1 cm, and the rod thickness is $\frac{1}{2}$ inch thick at an angle of 26.6° with the longitudinal axis.

In the operation of the invention, after the phantom is in place, the NMR scanner takes as many slices as possible in the XY plane by varying the Z position of the image acquisition. This is repeated for the XZ plane, with varying Y position, and the YZ plane with varying X position. Then the operator can calculate the intrinsic sensitivity, linearity as a function of proton concentration, slice thickness, slice spacing, slice continuity, signal to noise ratio, contrast to noise ratio, phase error detection (partial, in the quadrature detection of the received signal) and uniformity within a slice by well-known techniques.

FIGS. 6-11 are actual photographs of images taken of the phantom described herein during use at various values of Z along the longitudinal axis. The images were acquired on a 1.5T SIGNA GE NMR system.

On the enclosed images the following information is provided:

Pulse sequence: spin echo (SE)

The TR interval, or repetition time which was either 800, 1500, or 3000 ms.

The TE interval, or the time to the echo. Basically 25 or 30 ms was used.

The echo displayed. For all images only 1 echo was acquired. Multi refers to multislice multiecho sequence.

D Acq refers to the data acquisition matrix used. All studies were done on a 128×256 matrix.

FOV is the field of view. For this phantom the FOV was always 24 cm.

Thk is the slice thickness used. Either a 5 mm or 10 mm slice thickness was imaged.

NEX is the number of excitations for essentially each point in the matrix. Either 1 or 2 excitations were used. As the number of excitations increases so does the signal to noise ratio.

In addition on some images a region of interest can be displayed indicating the area within the box and the average or sum pixel intensity. The area within the itself provides little information without knowledge of the background intensity of the image.

Figure 6:
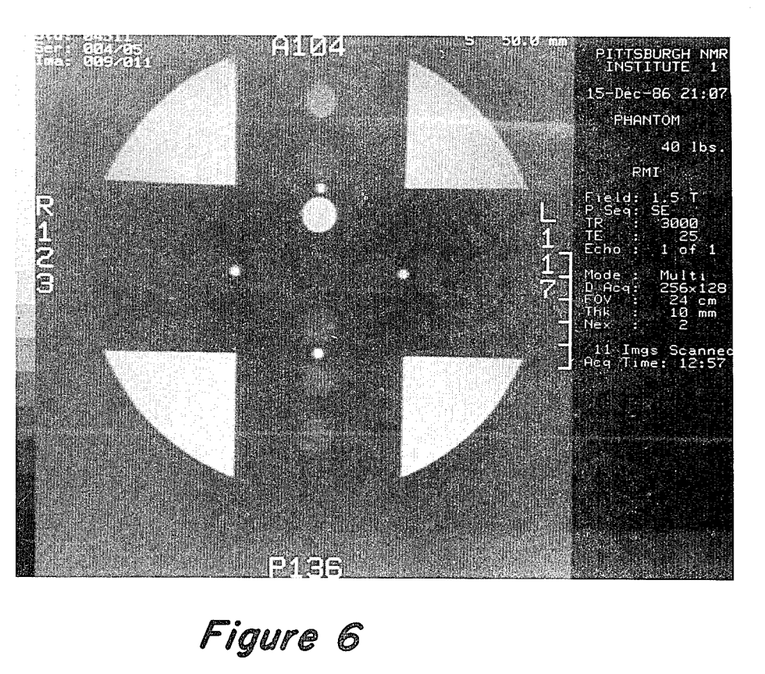
FIG. 6 is a cross-sectional image of the deuterium oxide tubes at a first level in the phantom.
Figure 7:
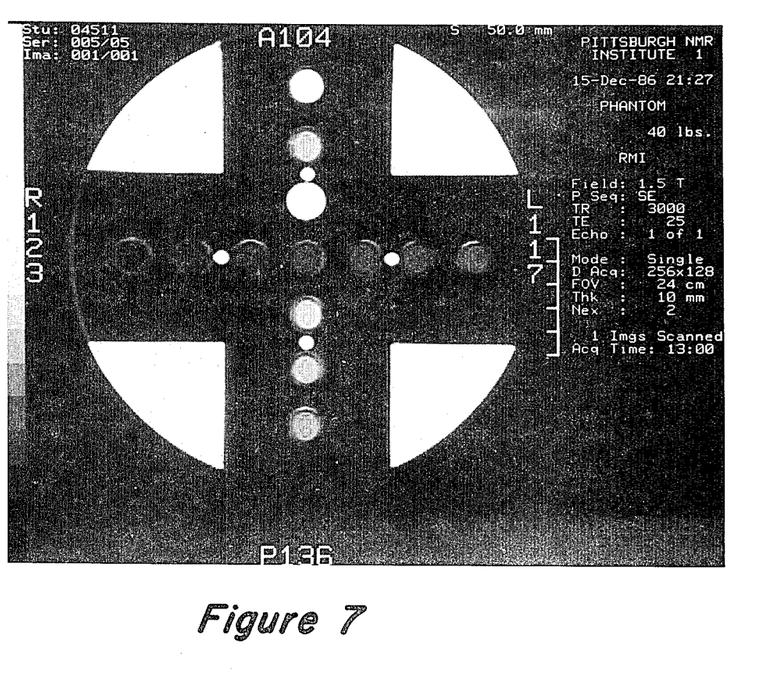
FIG. 7 is a cross-sectional image of the deuterium oxide tubes at the same level as FIG. 6 in the phantom, using a different pulse sequence.

The Deuterium/water tubes are shown in FIGS. 6 and 7. As can be seen as one changes the pulse sequence, the sensitivity to see a tube will change. If one would always use the same imaging parameters, then it would be possible to measure the intrinsic sensitivity of the machine on a daily basis for any significant change. In addition, by measuring ROI for different tubes, the background and the CuS solution, it is possible to measure the SNR on a daily basis. Moreover, the tubes allow one to see if there are ghosts in the images and inhomogeneities which do exist in these images.

Figure 8:
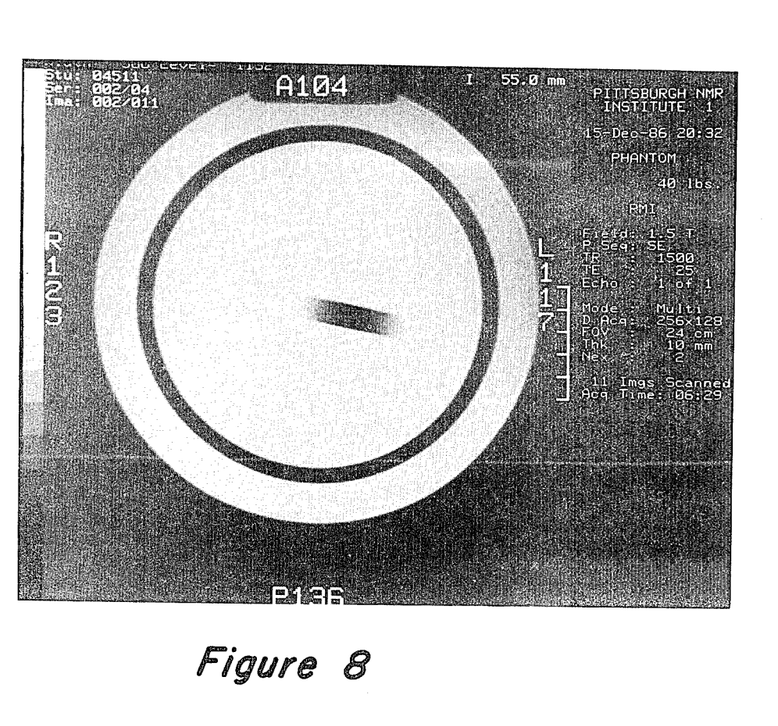
FIG. 8 is a cross-sectional image of the rod at a first level in the phantom.
Figure 9:
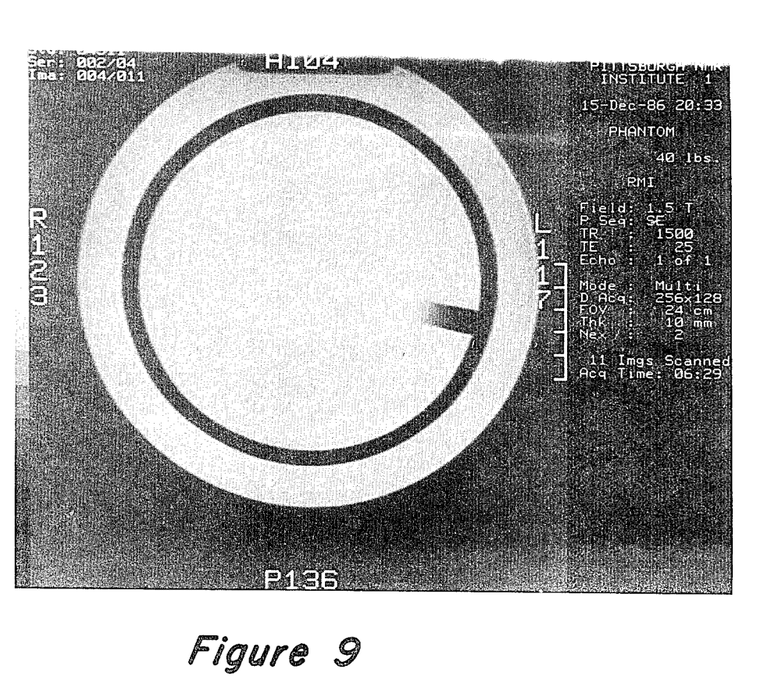
FIG. 9 is a cross-sectional image of the rod at a third level in the phantom.
Figure 10:
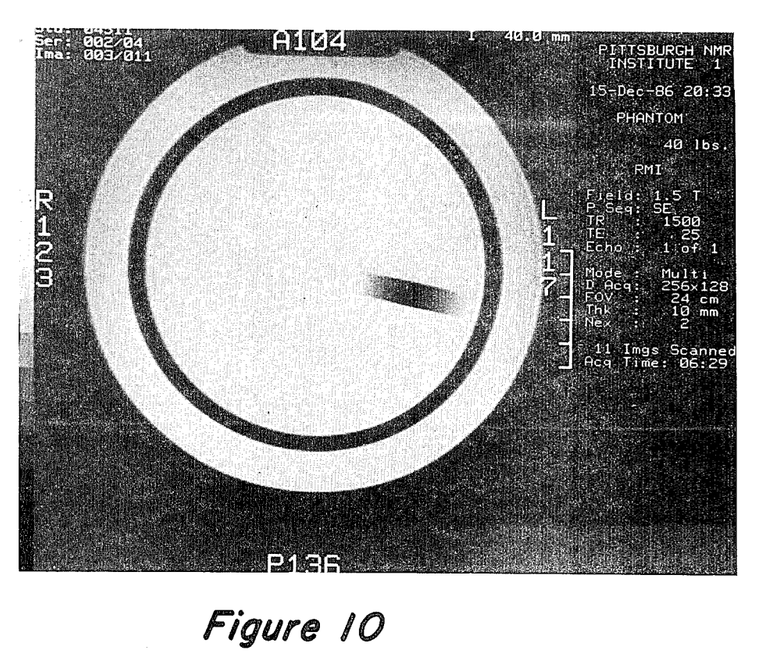
FIG. 10 is a cross-sectional image of the rod at a second level in the phantom.

For the slice thickness measurements, see FIGS. 8-10, the diagonal rod used was $\frac{1}{2}$ inch thick, therefore it is thicker than the slice, if slice thickness is less than 1.5 cm. therefore to determine the slice thickness, one must look to where the intensity in the image becomes greater than the background intensity image since the acrylic rod produces no signal. Based on this criteria, as shown in the images, a thickness can be determined. For a 10 mm slice thickness, the width of the rod will equal the thickness. As can be seen the width is close to the actual slice thickness. One will not have perfect correspondence, as one acquires data on a finite size matrix, with an object which is not on a 1:1 correspondence. (A measurement of a 10 mm thick slice could result in a 10.31 mm or 9.7 mm estimate, depending on the field of view used).

Figure 11:
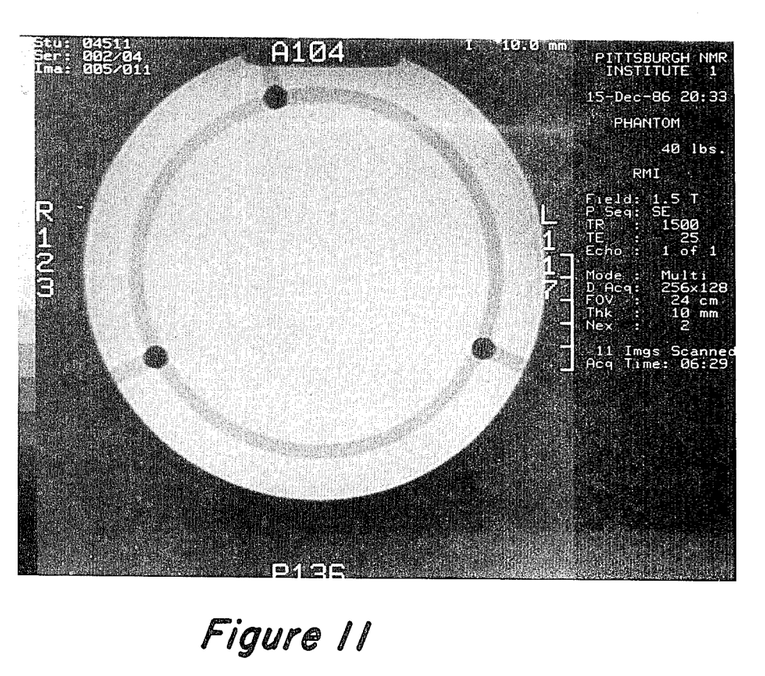
FIG. 11 is a cross-sectional image of the phantom near its top.

For a slice thickness of 5 mm, the width on the image will be a factor of three times the thickness because of the angle used. Therefore, the width should be around 15 mm. FIG. 11 shows an image of the very top of the phantom.

Lastly, as the loading of the RF coil of the NMR scanner changes, so will the intrinsic sensitivity of the NMR system. As the coil loading decreases, the sensitivity will change. Therefore, the minimum sensitivity measured with this phantom will not necessarily be the same with a different size phantom, a tube of plain water, or even a person or animal.

Obviously, numerous (additional) modifications and variations of the present invention are possible in light of the above teachings. It is therefore to be understood that within the scope of the appended claims, the invention may be practiced otherwisse than as specifically described herein.

I claim:

1. A phantom for quality assurance of an NMR scanner comprising a first sealed support structure made of a material having a short T1 and T2 decay constants so a signal is not produced by the first structure from the NMR scanner, said first structure being hollow and having a longitudinal axis;

a holder having a plurality of tubes, said holder positioned in the hollow of the first structure, said holder made of a material having short T1 and T2 decay constants so a signal is not produced by the holder from the NMR scanner, said tubes being sealed and having varying concentrations of a material whose T1 and T2 do not change as a function of concentration, said tubes being surrounded by enough holder material so a distinct image from each tube is produced form the NMR scanner, and any artifacts around each tube from the NMR scanner are apparent, said tubes allowing for the calculation of the intrinsic sensitivity and linearity of the NMR scanner;

a second support structure positioned inside the first support structure and adjacent the holder, said second structure supporting a rod that is fixed at an acute angle with respect to the longitudinal axis, said rod and second structure made of a material having short T1 and T2 decay constants so a signal is not produced from the NMR scanner, said rod allowing for the calculation of the slice thickness and slice spacing of the NMR scanner; and a paramagnetic material filling the hollow of the first structure and surrounding the holder and second structure with the rod.

2. A phantom as described in claim 1 wherein the material filling the tubes is deuterium oxide and water.

3. A phantom as described in claim 2 wherein one of said tubes is not sealed but filled with the paramagnetic material.

4. A phantom as described in claim 3 wherein the tubes in the holder are situated in two orthagonal rows with a common center tube.

5. A phantom as described in claim 4 wherein the paramagnetic material is either barium sulfate or copper sulfate.

6. A phantom as described in claim 5 wherein the first structure, the holder, the second structure and the rod are made of a transparent plastic polymer.

7. A phantom as described in claim 6 wherein the first structure is a sealed cylindrical tank being hollow and having a longitudinal axis.

8. A phantom as described in claim 7 wherein the second structure is a cylinder that fits into the first structure and is positioned adjacent the holder therein, said second structure supporting a rod that is fixed at an acute angle with respect to the longitudinal axis.

9. A phantom as described in claim 8 wherein the tank, holder, cylinder and rod are made of acrylic 10. A phantom as described in claim 9 wherein the paramagnetic material is a mixture of copper sulfate having a concentration of 0.004 mmol/ml in water with propanol added as a preservative.

11. A phantom for quality assurance of an NMR scanner comprising:

a first sealed support structure made of a material having short T1 and T2 decay constants so a signal is not produced by the first structure from the NMR scanner, said first structure being hollow and having a longitudinal axis;

a holder having a plurality of tubes, said holder positioned in the hollow of the first structure, said holder made of a material having short T1 and T2 decay constants so a signal is not produced by the holder from the NMR scanner, said tubes being sealed and having varying concentrations of a material whose T1 and T2 do not change as a function of concentration, said tubes being surrounded by enough holder material so a distinct image from each tube is produced from the NMR scanner, and any artifacts around each tube from the NMR scanner are apparent, said tubes allowing for the calculation of the intrinsic sensitivity and linearity of the NMR scanner; and a paramagnetic material filling the hollow of the first structure and surrounding the holder.

12. A phantom as described in claim 11 including a second support structure positioned inside the first support structure and adjacent the holder, said second structure supporting a rod that is fixed at an acute angle with respect to the longitudinal axis, said paramagnetic material surrounding the second structure and the rod, said rod and second structure made of a material having short T1 and T2 decay constants so a signal is not produced from the NMR scanner, and said rod allowing for the calculation of the slice thickness and slice spacing of the NMR scanner.

13. A phantom as described in claim 12 wherein the material filling the tubes is deuterium oxide and water.

14. A phantom as described in claim 13 wherein one of said tubes is not sealed but filled with the paramagnetic material in the first structure.

15. A phantom as described in claim 14 wherein the tubes in the holder are situated in two orthogonal rows with a common center tube.

16. A phantom as described in claim 15 wherein the paramagnetic material is either barium sulfate or copper sulfate.

17. A phantom as described in claim 16 wherein the first structure, the holder, the second structure and the rod are made of a transparent plastic polymer.

18. A phantom as described in claim 17 wherein the first structure is a sealed cylindrical tank being hollow and having a longitudinal axis.

19. A phantom as described in claim 18 wherein the second structure is a cylinder that fits into the first structure and is positioned adjacent the holder therein, said second structure supporting a rod that is fixed at an acute angle with respect to the longitudinal axis.

20. A phantom for quality assurance of an NMR scanner comprising:

a first sealed cylindrical tank that is hollow and has a longitudinal axis, said tank made out of acrylic;

a holder having a plurality of tubes disposed in the tank, said tubes being situated in two orthogonal rows with a common center tube, one of said tubes being unsealed, the remaining tubes beng sealed and filled with varying concentrations of deuterium oxide and water, said holder being made of acrylic, said tubes being surrounded by enough acrylic so a distinct image from each tube is produced from the NMR scanner, and any artifacts around each tube from the NMR scanner are apparent, said tubes allowing for the calculation of the intrinsic sensitivity and linearity of the NMR scanner;

a cylinder that fits into the tank and is positioned adjacent the holder therein, said cylinder supporting a rod that is fixed at an acute angle with respect to the longitudinal axis of the tank, said rod and cylinder made of acrylic, said rod allowing for the calculation of the slice thickness and slice spacing of the NMR scanner; and a mixture of copper sulfate having a concentration of 0.004 mmol/ml in water with propanol added as a preservative filling the unsealed tube and the hollow of the tank, and surrounding the holder and cylinder.

* * * * *

UNITED STATES PATENT AND TRADEMARK OFFICE
CERTIFICATE OF CORRECTION

PATENT NO.  : 4,777,442

DATED       : October 11, 1988

INVENTOR(S) : Marc S. Rosenthal

It is certified that error appears in the above-identified patent and that said Letters Patent is hereby corrected as shown below:

In the Abstract, line 9, the phrase "copper" should read -- copper sulfate -- .

At column 1, line 6, the word "more" should be -- More -- .

At column 3, line 1, the phrase "which is a preferrd" should read -- which in a preferred -- .

In Claim 1, at column 7, line 4, the word "form" should be -- from -- .

Signed and Sealed this

Twenty-eighth Day of March, 1989

*Attest:*

DONALD J. QUIGG

*Attesting Officer*     *Commissioner of Patents and Trademarks*